(12) United States Patent
Arakawa et al.

(10) Patent No.: US 7,923,906 B2
(45) Date of Patent: Apr. 12, 2011

(54) PROCESS FOR FORMING A FERROELECTRIC FILM, FERROELECTRIC FILM, FERROELECTRIC DEVICE, AND LIQUID DISCHARGE APPARATUS

(75) Inventors: Takami Arakawa, Kanagawa-ken (JP); Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 400 days.

(21) Appl. No.: 12/203,596

(22) Filed: Sep. 3, 2008

(65) Prior Publication Data

US 2009/0058953 A1 Mar. 5, 2009

(30) Foreign Application Priority Data

Sep. 5, 2007 (JP) ................................. 2007-229792

(51) Int. Cl.
*H01L 41/187* (2006.01)
(52) U.S. Cl. ................. 310/358; 204/192.18; 204/192.2
(58) Field of Classification Search .................. 310/358; 204/192.18, 192.2
See application file for complete search history.

(56) References Cited

U.S. PATENT DOCUMENTS

| | | | |
|---|---|---|---|
| 5,308,462 A | 5/1994 | Iijima et al. | |
| 5,792,324 A * | 8/1998 | Seon ........................ | 204/192.15 |
| 6,287,986 B1 | 9/2001 | Mihara | |
| 2002/0142489 A1 | 10/2002 | Matsuura et al. | |
| 2007/0046153 A1 | 3/2007 | Matsuda et al. | |
| 2007/0084717 A1* | 4/2007 | Nagashima ................ | 204/192.2 |
| 2008/0081128 A1* | 4/2008 | Fujii ............................. | 427/569 |
| 2008/0231667 A1* | 9/2008 | Arakawa et al. ............... | 347/71 |
| 2010/0039481 A1* | 2/2010 | Fujii et al. ....................... | 347/68 |

FOREIGN PATENT DOCUMENTS

| | | |
|---|---|---|
| EP | 0 237 250 | 9/1987 |
| EP | 1 096 570 A1 | 5/2001 |
| JP | 2001-206769 A | 7/2001 |
| JP | 2001-253774 A | 9/2001 |
| JP | 2006-96647 A | 4/2006 |
| JP | 2006-188414 A | 7/2006 |

OTHER PUBLICATIONS

Higuma, Y. et al., "Epitaxial Growth of PLZT Single Crystal Film on $SrTiO_3$ by RF Sputtering," Japan Journal of Applied Physics, vol. 16, No. 9, 1977, pp. 1707-1708.
Stuart, R. and Wehner, G., "Sputtering Yields at Very Low Bombarding Ion Energies," Journal of Applied Physics, vol. 33, No. 7, 1962, pp. 2345-2352.
Leng, W. et al.,"Structure-related Optical Properties of (Pb, La)(Zr, Ti) 03 thin films on indium tin oxide/quartz substrates," Journal of Applied Physics, vol. 100, No. 8, 2006, pp. 83505-083505.
Takahashi, "Effects of Impurity Doping in Lead Zirconate-Titanate Ceramics," Ferroelectrics, vol. 41, 1982, pp. 143-156.

* cited by examiner

*Primary Examiner* — Thomas M Dougherty
(74) *Attorney, Agent, or Firm* — Birch, Stewart, Kolasch & Birch, LLP

(57) ABSTRACT

A ferroelectric film containing a perovskite type oxide represented by Formula (P) is formed on a substrate, which stands facing a target, by a sputtering technique under conditions of a height of a shield, which surrounds an outer periphery of the target on the substrate side in a non-contact state and comprises shielding layers superposed one upon another at intervals, such that a difference between a plasma potential and a floating potential is at most 35V, and under conditions such that a temperature of the substrate is at least 400° C.:

$$(Pb_{1-x+\delta}M_x)(Zr_yTi_{1-y})O— \qquad (P)$$

wherein M represents at least one kind of element selected from Bi and lanthanide elements, $0.05 \leqq x \leqq 0.4$, and $0<y \leqq 0.7$, the standard composition being such that $\delta=0$, and $z=3$.

11 Claims, 7 Drawing Sheets

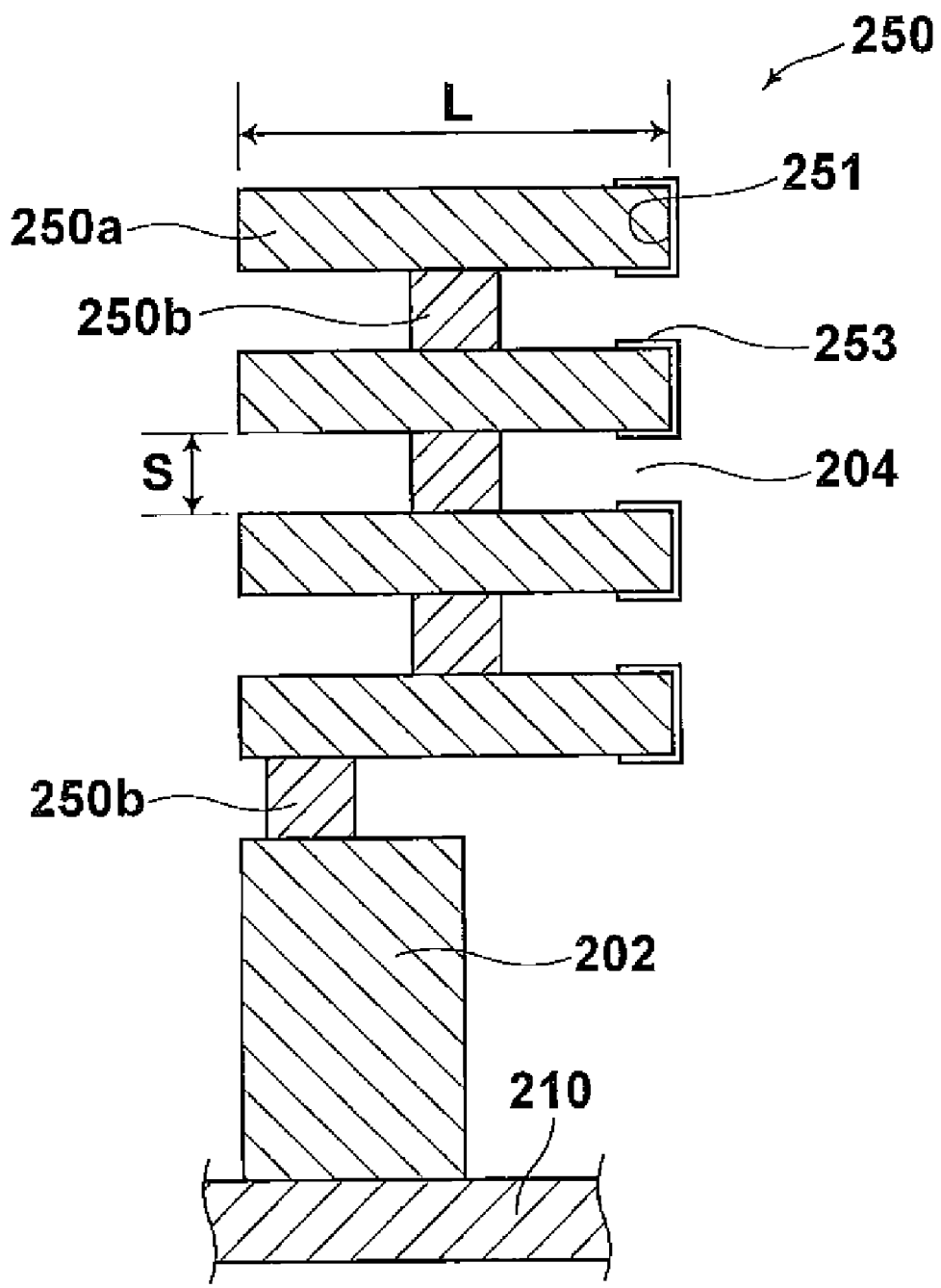

PROCESS FOR FORMING A FERROELECTRIC FILM, FERROELECTRIC FILM, FERROELECTRIC DEVICE, AND LIQUID DISCHARGE APPARATUS

BACKGROUND OF THE INVENTION

1. Field of the Invention

This invention relates to a process for forming a ferroelectric film containing a perovskite type oxide, which is of a PZT type. This invention also relates to a ferroelectric film obtainable by the process for forming a ferroelectric film. This invention further relates to a ferroelectric device, which comprises the ferroelectric film, and a liquid discharge apparatus utilizing the ferroelectric device.

2. Description of the Related Art

Piezoelectric devices provided with a piezoelectric body, which has piezoelectric characteristics such that the piezoelectric body expands and contracts in accordance with an increase and a decrease in electric field applied across the piezoelectric body, and electrodes for applying the electric field across the piezoelectric body have heretofore been used for use applications, such as actuators to he loaded on ink jet type recording heads. As piezoelectric body materials, there have heretofore been widely used perovskite type oxides, such as lead zirconate titanate (PZT). The materials described above are ferroelectric substances, which have spontaneous polarization characteristics at the time free from electric field application.

It has been known from the 1960s that PZT having been doped with donor ions having a valence number higher than the valence number of substitutable ions exhibit the characteristics, such as ferroelectric performance, having been enhanced over the characteristics of genuine PZT. As the donor ions capable of substituting $Pb^{2-}$ ions at an A site, there have been known $Bi^{3+}$ ions and various kinds of lanthanoid cations, such as $La^{3+}$ ions. As the donor ions capable of substituting $Zr^{4+}$ ions and/or $Ti^{4+}$ ions at a B site, there have been known $V^{5+}$ ions, $Nb^{5+}$ ions, $Ta^{5+}$ ions, $Sb^{5+}$ ions, $Mo^{6+}$ ions, $W^{6+}$ ions, and the like.

The ferroelectric substances have heretofore been produced with, for example, a technique wherein multiple kinds of oxide particles containing constituent elements for a desired composition are mixed together, and wherein the thus obtained mixed particles are subjected to molding processing and firing processing, or a technique wherein multiple kinds of oxide particles containing constituent elements for a desired composition are dispersed in an organic binder, and wherein the thus obtained dispersion is coated on a substrate and fired. With the aforesaid techniques for producing the ferroelectric substances, the ferroelectric substances have been produced via the firing processing at a temperature of at least 600° C., ordinarily at a temperature of at least 1,000° C. With the aforesaid techniques for producing the ferroelectric substances, since the production processing is performed in the high-temperature thermal-equilibrium state, a dopant having a valence number, which does not match, is not capable of being doped at a high concentration.

Studies on doping of various kinds of donor ions to a PZT bulk ceramic material are described in, for example, "Effects of Impurity Doping in Lead Zirconate-Titanate Ceramics", S. Takahashi, Ferroelectrics, Vol. 41, pp. 143-156, 1982. FIG. 10 is a graph illustrating FIG. 14 of the literature described above. Specifically, FIG. 10 is a graph showing a relationship between a donor ion doping concentration and a dielectric constant. In FIG. 10, it is illustrated that the characteristics become best at a donor ion doping concentration of approximately 1.0 mol % (corresponding to approximately 0.5 wt % in the cases of FIG. 10), and that the characteristics become bad in cases where the donor ion doping concentration is higher than approximately 1.0 mol %. It is presumed that, in cases where the donor ion doping concentration is higher than approximately 1.0 mol %, a part of the donor ions, which part are not capable of forming a solid solution because of valence number mismatch, undergo segregation at particle boundaries, and the like, and the characteristics are thus caused to become bad.

Recently, ferroelectric substances, in which the donor ions have been doped at the A site at doping concentrations higher than those in "Effects of Impurity Doping in Lead Zirconate-Titanate Ceramics", S. Takahashi, Ferroelectrics, Vol. 41, pp. 143-156, 1982, have been disclosed in, for example, Japanese Unexamined Patent Publication Nos. 2006-096647, 2001-206769, 2001-253774, and 2006-188414.

A PZT type ferroelectric film, in which Bi has been doped at the A site at a doping concentration falling within the range of more than 0 mol % to less than 100 mol %, and in which Nb or Ta has been doped at the B site at a doping concentration falling within the range of 5 mol % to 40 mol %, is disclosed in Japanese Unexamined Patent Publication No. 2006-096647 (Claim 1 thereof). The disclosed ferroelectric film is formed with a sol-gel technique. The sol-gel technique is the thermal-equilibrium processing. With the ferroelectric film disclosed in Japanese Unexamined Patent Publication No. 2006-096647, such that the sintering may be promoted and such that the thermal-equilibrium state may be obtained, it is essential to dope Si as a sintering auxiliary. (Reference may be made to, for example, a paragraph [0108] of Japanese Unexamined Patent Publication No. 2006-096647.)

In Japanese Unexamined Patent Publication No. 2006-096647, it is described that, with the Bi doping at the A site, oxygen deficiency is capable of being suppressed, and electric current leakage is capable of being suppressed. (Reference may be made to, for example, a paragraph [0040] of Japanese Unexamined Patent Publication No. 2006-096647.) Also, in Japanese Unexamined Patent Publication No. 2006-096647, it is described that, as the doping concentration of Bi and the doping concentration of Nb or Ta are set to be high, rectangularity of polarization-electric field hysteresis is capable of being enhanced, and the polarization-electric field hysteresis is capable of becoming appropriate. (Reference may be made to, for example, a paragraph [0114] of Japanese Unexamined Patent Publication No. 2006-096647.)

A PZT type bulk sintered body, which contains 0.01% by weight to 10% by weight of $Bi_2O_3$ and 0.01% by weight to 10% by weight of $GeO_2$, is disclosed in Japanese Unexamined Patent Publication No. 2001-206769. Also, a PZT type bulk sintered body, which contains 0.01% by weight to 10% by weight of $Bi_2O_3$ and 0.01% by weight to 10% by weight of $V_2O_5$, is disclosed in Japanese Unexamined Patent Publication No. 2001-253774. In Japanese Unexamined Patent Publication Nos. 2001-206769 and 2001-253774, it is described that, by the doping of Ge or V as the sintering auxiliary, the sintering processing is capable of being performed at a comparatively low temperature.

Further, a PZT type bulk sintered body wherein, for the valence number matching, Bi acting as donor ions having a high valence number and Sc or In acting as acceptor ions having a low valence number have been co-doped, is disclosed in Japanese Unexamined Patent Publication No. 2006-188414.

With the ferroelectric substances described in Japanese Unexamined Patent Publication Nos. 2006-096647, 2001-206769, and 2001-253774, such that the sintering may be promoted and such that the thermal-equilibrium state may be obtained, it is essential to dope Si, Ge, or V as the sintering auxiliary. However, in cases where the sintering auxiliary described above is doped, the ferroelectric characteristics become bad. Therefore, with the techniques described in Japanese Unexamined Patent Publication Nos. 2006-096647, 2001-206769, and 2001-253774, the effect of the donor ion doping at the A site is not always capable of being derived sufficiently.

Also, V used in Japanese Unexamined Patent Publication No. 2001-253774 acts as the donor ions at the B site. An ionic radius of V is smaller than the ionic radius of each of Nb and Ta, and it is considered that the effect of V as the donor ions will be smaller than the effect of each of Nb and Ta. Further, it is preferable that $V_2O_5$, which has a high toxicity, is not used.

With the ferroelectric substance described in Japanese Unexamined Patent Publication No. 2006-188414, for the valence number matching, the donor ions having a high valence number and the acceptor ions having a low valence number are co-doped. However, it has been known that the acceptor ions having a low valence number act to lower the ferroelectric characteristics. With the system, in which the acceptor ions are co-doped, the effect of the donor ion doping is not always capable of being derived sufficiently.

Also, with size reduction and weight reduction made in electronic equipment and enhancement of functions made in electronic equipment in recent years, there has arisen a tendency toward the reduction in size and weight of piezoelectric devices and enhancement of functions of the piezoelectric devices. For example, in the cases of the piezoelectric devices for use in the ink jet type recording heads, such that images having good image quality may be obtained, it has recently been studied to enhance array density of the piezoelectric devices. Further, such that the array density of the piezoelectric devices may be enhanced, it has recently been studied to reduce the thicknesses of the piezoelectric devices. The ferroelectric substances should preferably take on the form of a thin film.

In Japanese Unexamined Patent Publication Nos. 2001-206769, 2001-253774, and 2006-188414, the bulk sintered body is taken as the object. In Japanese Unexamined Patent Publication No. 2006-096647, the formation of the ferroelectric film with the sol-gel technique is described. With the sol-gel technique, in cases where the film thickness is set to be large, cracks arise readily. Therefore, with the sol-gel technique, it is not always possible to form a thin film having a thickness larger than 1 µm. In the use applications for ferroelectric memories, and the like, the ferroelectric film may be a thin film having a thickness of at most 1 µm. However, in the use applications for the piezoelectric devices, with the ferroelectric film having a thickness of at most 1 µm, sufficient displacement is not capable of being obtained. Therefore, in the use applications for the piezoelectric devices, the film thickness of the ferroelectric film should preferably be at least 3 µm. It will be possible to set the film thickness to be large with a technique, wherein the lamination of a thin film is iterated. However, the technique for iterating the lamination of a thin film will not be practicable. Also, with the sol-gel technique, Pb deficiency is apt to occur. In cases where the Pb deficiency occurs, there is a tendency for the ferroelectric performance to become bad.

SUMMARY OF THE INVENTION

The primary object of the present invention is to provide a process for forming a ferroelectric film containing a perovskite type oxide, which is of a PZT type, wherein a sintering auxiliary or acceptor ions need not be doped, and wherein donor ions are capable of being doped in a doping concentration of at least 5 mol % at an A site.

Another object of the present invention is to provide a ferroelectric film containing a perovskite type oxide, which is of a PZT type, which has been doped with donor ions in a doping concentration of at least 5 mol % at an A site, and which has good ferroelectric performance.

A further object of the present invention is to provide a ferroelectric film containing a perovskite type oxide, which is of a PZT type, which is free from A site deficiency, which has been doped with donor ions in a doping concentration of at least 5 mol % at the A site, and which has good ferroelectric performance.

A still further object of the present invention is to provide a ferroelectric film containing a perovskite type oxide, which is of a PZT type, which has been doped with donor ions in a doping concentration of at least 5 mol % at an A site, and which has good ferroelectric performance, the ferroelectric film being capable of having a film thickness of at least 3.0 µm.

Another object of the present invention is to provide a ferroelectric device, which comprises the ferroelectric film.

A further object of the present invention is to provide a liquid discharge apparatus utilizing the ferroelectric device.

The present invention provides a process for forming a ferroelectric film on a substrate by a sputtering technique, the ferroelectric film containing a perovskite type oxide that is represented by Formula (P) shown below, wherein a target, which has a composition in accordance with the film composition of the ferroelectric film to be formed, and the substrate are located at a spacing from each other, a shield, which surrounds an outer periphery of the target on the substrate side, is located in a non-contact state with respect to the target, the shield being provided with a plurality of shielding layers, which are superposed one upon another at intervals with respect to the direction of the superposition, and the ferroelectric film is formed on the substrate by the sputtering technique under conditions of a height of the shield such that a difference Vs–Vf (V) between a plasma potential Vs (V) in plasma at the time of the film formation by the sputtering technique and a floating potential Vf (V) becomes equal to at most 35 eV, and under conditions such that a temperature of the substrate becomes equal to at least 400° C.:

$$(Pb_{1-x+\delta}M_x)(Zr_yTi_{1-y})O— \quad (P)$$

wherein M represents at least one kind of element selected from the group consisting of Bi and lanthanide elements (i.e., the elements (La to Lu) of the element numbers 57 to 71), x represents a number satisfying the condition of $0.05 \leq x \leq 0.4$, and y represents a number satisfying the condition of $0 < y \leq 0.7$, the standard composition being such that $\delta=0$, and $z=3$, with the proviso that the value of $\delta$ and the value of z may deviate from the standard values of 0 and 3, respectively, within a range such that the perovskite structure is capable of being attained.

The term "film formation temperature Ts (° C.)" as used herein means the center temperature of the substrate, on which the film is to be formed.

Also, each of the term "plasma potential Vs" and the term "floating potential Vf" as used herein means the value as measured with a single probe technique utilizing a Langmuir probe. Such that an error may not occur due to clinging of the film, which is being formed, or the like, to the probe, the measurement of the floating potential Vf should be performed as quickly as possible with a probe end being located in the vicinity of the substrate (at a position approximately 10 mm spaced from the substrate).

The potential difference Vs–Vf (V) between the plasma potential Vs and the floating potential Vf is capable of being converted directly into an electron temperature (eV). The electron temperature of 1 eV corresponds to 11,600K (where K represents the absolute temperature).

The process for forming a ferroelectric film in accordance with the present invention should preferably be modified such that M in Formula (P) represents Bi. In such cases, the process for forming a ferroelectric film in accordance with the present invention should more preferably be modified such that x represents a number satisfying the condition of $0.05 \leq x \leq 0.25$.

The process for forming a ferroelectric film in accordance with the present invention is capable of providing the ferroelectric film containing the perovskite type oxide having a composition, in which δ represents a number satisfying the condition of $0<\delta \leq 0.2$, and which is rich in A site element.

The process for forming a ferroelectric film in accordance with the present invention is capable of providing the ferroelectric film containing the perovskite type oxide, which is substantially free from Si, Ge, and V. The term "substantially free from Si, Ge, and V" as used herein means that the concentration of each element, which concentration is detected with an X-ray fluorescence analysis from a surface of the perovskite type oxide (e.g., in the cases of a perovskite type oxide film, a surface of the film), is less than 0.1 wt % in the cases of Si and is less. than 0.01% in the cases of each of Ge and V.

The present invention further provides a ferroelectric film obtainable by the process for forming a ferroelectric film in accordance with the present invention.

The ferroelectric film in accordance with the present invention is capable of being furnished as the ferroelectric film having characteristics such that a value of (Ec1+Ec2)/(Ec1−Ec2)×100 (%) is equal to at most 25%, wherein Ec1 represents the coercive field on the positive electric field side in a bipolar polarization-electric field curve, and Ec2 represents the coercive field on the negative electric field side in the bipolar polarization-electric field curve.

Also, the ferroelectric film in accordance with the present invention is capable of being furnished as the ferroelectric film having a film structure containing a plurality of pillar-shaped crystals.

Further, the ferroelectric film in accordance with the present invention is capable of being furnished as the ferroelectric film having a film thickness of at least 3.0 μm.

The present invention still further provides a ferroelectric device, comprising:
  i) a ferroelectric film in accordance with the present invention, and
  ii) electrodes for applying an electric field across the ferroelectric film.

The present invention also provides a liquid discharge apparatus, comprising:
  i) a piezoelectric device, which is constituted of a ferroelectric device in accordance with the present invention, and
  ii) a liquid storing and discharging member provided with:
    a) a liquid storing chamber, in which a liquid is to be stored, and
    b) a liquid discharge opening, through which the liquid is to be discharged from the liquid storing chamber to the exterior of the liquid storing chamber.

With the process for forming a ferroelectric film containing the perovskite type oxide, which is of the PZT type, in accordance with the present invention, the sintering auxiliary or the acceptor ions need not be doped, and the donor ions are capable of being doped in a doping concentration falling within the range of 5 mol % to 40 mol % at the A site. With the process for forming a ferroelectric film containing the perovskite type oxide in accordance with the present invention, it is possible to obtain the ferroelectric film containing the perovskite type oxide, which has been doped with the donor ions in the high doping concentration falling within the range of 5 mol % to 40 mol % at the A site, and which has good ferroelectric performance (good piezoelectric performance). With the process for forming a ferroelectric film containing the perovskite type oxide in accordance with the present invention, wherein the sintering auxiliary or the acceptor ions need not be doped, and wherein the donor ions are capable of being doped in the high doping concentration described above at the A site, the lowering of the ferroelectric performance due to the sintering auxiliary or the acceptor ions is capable of being suppressed, and the enhancement of the ferroelectric performance by the doping with the donor ions is capable of being derived sufficiently.

The present invention will hereinbelow be described in further detail with reference to the accompanying drawings.

BRIEF DESCRIPTION OF THE DRAWINGS

FIG. 2 is an enlarged view showing a shield and its vicinity in FIG. 1A,

DETAILED DESCRIPTION OF THE INVENTION

[Perovskite Type Oxide, Ferroelectric Film]

Figure 1A:
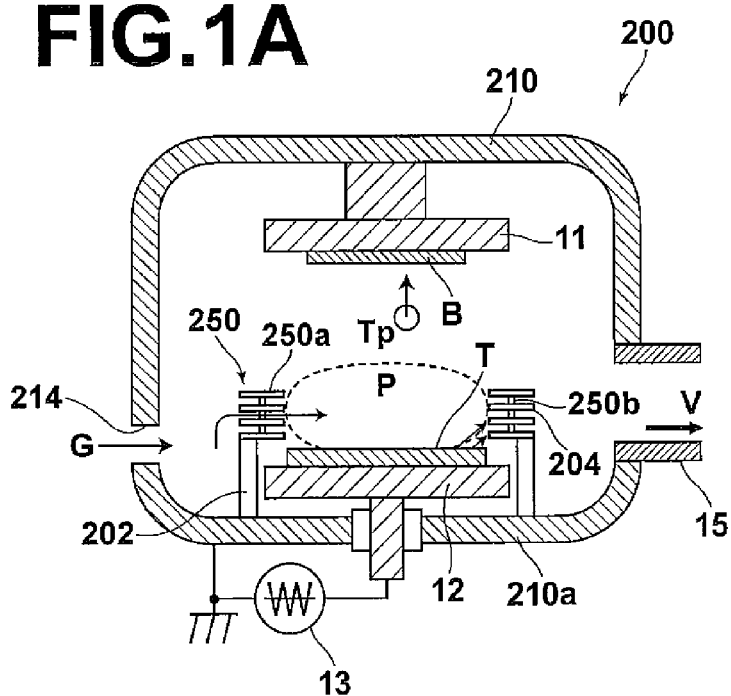
FIG. 1A is a schematic sectional view showing a sputtering apparatus.

The inventors have found that, in cases where the film formation is performed by the sputtering technique, which is the non-thermal-equilibrium processing, the sintering auxiliary or the acceptor ions need not be doped, and the donor ions are capable of being doped in the doping concentration of at least 5 mol % at the A site of lead zirconate titanate (PZT). Specifically, the inventors have found that the donor ions are capable of being doped in the doping concentration falling within the range of 5 mol % to 40 mol % at the A site of PZT.

More specifically, the perovskite type oxide contained in the ferroelectric film in accordance with the present invention is characterized by being represented by Formula (P) shown below:

$$(Pb_{1-x+\delta}M_x)(Zr_yTi_{1-y})O— \qquad (P)$$

wherein M represents at least one kind of element selected from the group consisting of Bi and lanthanide elements, x represents a number satisfying the condition of $0.05 \leq x \leq 0.4$, and y represents a number satisfying the condition of $0 < y \leq 0.7$, the standard composition being such that $\delta=0$, and $z=3$, with the proviso that the value of $\delta$ and the value of z may deviate from the standard values of 0 and 3, respectively, within a range such that the perovskite structure is capable of being attained.

The ferroelectric film in accordance with the present invention is characterized by containing the aforesaid perovskite type oxide in accordance with the present invention.

The present invention is capable of providing the ferroelectric film, which contains the aforesaid perovskite type oxide in accordance with the present invention as a principal constituent. The term "principal constituent" as used herein means that the proportion of the constituent is equal to at least 80% by mass.

With the ferroelectric substances described in Japanese Unexamined Patent Publication Nos. 2006-096647, 2001-206769, and 2001-253774, it is essential to dope Si, Ge, or V as the sintering auxiliary. In accordance with the present invention, it is possible to provide the ferroelectric film containing the perovskite type oxide, which is substantially free from Si, Ge, and V. As the sintering auxiliary, there has also been known Sn. In accordance with the present invention, it is also possible to provide the ferroelectric film containing the perovskite type oxide, which is substantially free from Sn.

With the technique disclosed in Japanese Unexamined Patent Publication No. 2006-188414, such that the donor ions may be doped at a high doping concentration, Sc ions or In ions acting as the acceptor ions are co-doped. In accordance with the present invention, it is possible to provide the ferroelectric film containing the perovskite type oxide, which is substantially free from the acceptor ions described above.

It has been known that the doping of the sintering auxiliary or the acceptor ions causes the ferroelectric performance to become low. With the ferroelectric film containing the perovskite type oxide in accordance with the present invention, wherein the sintering auxiliary or the acceptor ions need not be doped, the lowering of the ferroelectric performance due to the sintering auxiliary or the acceptor ions is capable of being suppressed, and the enhancement of the ferroelectric performance by the doping with the donor ions is capable of being derived sufficiently. As described above, with the ferroelectric film containing the perovskite type oxide in accordance with the present invention, the sintering auxiliary or the acceptor ions need not be doped. However, the sintering auxiliary or the acceptor ions may be doped within a range such that the adverse effect on the characteristics may not occur markedly.

The perovskite type oxide contained in the ferroelectric film in accordance with the present invention, which perovskite type oxide has been doped with the donor ions in the doping concentration failing within the range of 5 mol % to 40 mol % at the A site, is advantageous over genuine PZT or PZT, which has been doped with the donor ions at the B site of PZT, in that the Pb concentration may be kept low, and in that a load on the environment may be kept light.

The inventors have found that the PZT film, in which Nb, Ta, or W acting as the donor ions has been doped at the B site of PZT, exhibits an asymmetric hysteresis, in which a bipolar polarization-electric field curve (PE curve) is biased toward the positive electric field side, and that the ferroelectric film containing the perovskite type oxide in accordance with the present invention, in which to donor ions have been doped at the A site, the asymmetric hysteresis of the PE curve is relieved to hysteresis close to a symmetric hysteresis. The asymmetry of the PE hysteresis may be defined by the state in which the coercive field Ec1 on the positive electric field side and the absolute value of the coercive field Ec2 on the negative electric field side are different from each other (i.e., $Ec1 \neq |Ec2|$).

Ordinarily, the ferroelectric film is used in the form of a ferroelectric device, in which a bottom electrode, the ferroelectric film, and a top electrode are overlaid one upon another in this order. Either one of the bottom electrode and the top electrode is taken as a ground electrode, at which the applied electrode is fixed at 0V, and the other electrode is taken as an address electrode, at which the applied voltage is varied. Ordinarily, for easiness of actuation, the bottom electrode is taken as the ground electrode, and the top electrode is taken as the address electrode. The term "state in which a negative electric field is applied to a ferroelectric film" as used herein means that a negative voltage is applied to the address electrode. Also, the term "state in which a positive electric field is applied to a ferroelectric film" as used herein means that a positive voltage is applied to the address electrode.

As for the ferroelectric film, which has the PE asymmetric hysteresis biased to the positive electric field side, the polarization is not apt to occur with the application of the positive electric field and is apt to occur with the application of the negative electric field. In such cases, the piezoelectric characteristics are not apt to occur with the application of the positive electric field and are apt to occur with the application of the negative electric field. In order for the negative electric field to be applied, it is necessary for an actuation driver IC for the top electrode to be set for the negative voltage. However, the IC for the negative voltage is not used widely and requires a high IC development cost. In cases where the bottom electrode is subjected to patterning processing and is taken as the address electrode, and the top electrode is taken as the ground electrode, an actuation driver IC for the positive electrode, which IC has been used widely, is capable of being utilized. However, in such cases, the production process is not capable of being kept simple.

With the ferroelectric film in accordance with the present invention, the PE curve becomes close to the symmetric hysteresis. Therefore, the ferroelectric film in accordance with the present invention is advantageous from the view point of easiness of the actuation.

The level of the asymmetric hysteresis of the PE curve is capable of being evaluated with the value of $(Ec1+Ec2)/(Ec1-Ec2) \times 100$ (%), wherein Ec1 represents the coercive field on the positive electric field side in the PE curve, and Ec2 represents the coercive field on the negative electric field side in the PE curve. A large value of (Ec1+Ec2)/(Ec1−Ec2)×100 (%) represents that the asymmetry of the PE hysteresis is high. The present invention is capable of providing the ferroelectric film having the characteristics such that the value of (Ec1 +Ec2)/(Ec1−Ec2)×100 (%) is equal to at most 25%. (Reference may be made to Example 1, which will be described later, and FIG. 9.)

The perovskite type oxide contained in the ferroelectric film in accordance with the present invention should preferably be modified such that M in Formula (P) represents Bi. The inventors have found that, in cases where M in Formula (P) represents Bi, it is possible to obtain the ferroelectric film, which exhibits the PE curve close to the symmetric hysteresis, and which at the same time has good ferroelectric performance. As described above under "Description of the Related Art," it is described in Japanese Unexamined Patent Publication No. 2006-096647 that, in cases where Bi and either one of Nb and Ta are co-doped, the rectangularity of the PE hysteresis is capable of being enhanced, and the PE hysteresis is capable of becoming appropriate. However, the inventors have found that the system in accordance with the present invention, in which only the A site donor ions are doped, exhibits better PE hysteresis symmetry than the system described in Japanese Unexamined Patent Publication No. 2006-096647, in which Bi acting as the A site donor ions and either one of Nb and Ta acting as the B site donor ions are co-doped.

The perovskite type oxide contained in the ferroelectric film in accordance with the present invention may contain a heterogeneous phase within a range such that the adverse effect on the characteristics may not occur markedly. However, the inventors have confirmed with X-ray diffraction (XRD) measurement that, in cases where M in Formula (P) represents Bi, the perovskite type oxide having a single phase structure is capable of being obtained at least within the range of x in Formula (P) of $0.05 \leq x \leq 0.30$.

Also, the inventors have found that, in cases where M in Formula (P) represents Bi, and x in Formula (P) represents a number falling within the range of $0.05 \leq x \leq 0.25$, the perovskite type oxide is capable of being obtained, which exhibits a particularly high dielectric constant E, a particularly high maximum polarization intensity Pmax, and the like, and which has good ferroelectric performance. (Reference may be made to Example 1, which will be described later, and FIG. 8.) Therefore, from the view point of the ferroelectric performance, in cases where M in Formula (P) represents Bi, x in Formula (P) should preferably represent a number falling within the range of $0.05 \leq x \leq 0.25$. From the view point of the effect of reducing the load with respect to the environment by virtue of the reduction in Pb concentration, x in Formula (P) should preferably represent a number falling within the range of $0.25 \leq x \leq 0.40$, such that the Bi doping concentration may be higher than the range described above.

Further, the value of y in Formula (P), which value is associated with the composition of Ti and Zr, should fall within the range of $0 < y \leq 0.7$. In order for the ferroelectric performance having been enhanced even further to be obtained, the value of y in Formula (P) should preferably be set such that a composition in the vicinity of the composition at a morphotropic phase boundary (MPB), which represents the phase transition point between a tetragonal phase and a rhombohedral phase, may be obtained. Specifically, the value of y in Formula (P) should preferably fall within the range of $0.45 < y \leq 0.7$, and should more preferably fall within the range of $0.47 < y < 0.57$.

With the sol-gel technique described in Japanese Unexamined Patent Publication No. 2006-096647, the Pb deficiency is apt to occur. In cases where the Pb deficiency occurs, there is a tendency for the ferroelectric performance to become bad. However, in accordance with the present invention, it is possible to provide the ferroelectric film containing the perovskite type oxide having the composition, in which the value of δ in Formula (P) falls within the range of $δ \geq 0$, and which is free from deficiency in A site element. In accordance with the present invention, it is also possible to provide the ferroelectric film containing the perovskite type oxide having the composition, in which the value of δ in Formula (P) falls within the range of $δ > 0$, and which is rich in A site element. Specifically, the inventors have found that, in accordance with the present invention, it is possible to provide the ferroelectric film containing the perovskite type oxide having the composition, in which the value of δ in Formula (P) falls within the range of $0 < δ \leq 0.2$, and which is rich in A site element. As described above, in accordance with the present invention, it is possible to provide the ferroelectric film containing the perovskite type oxide having the composition, in which the value of δ in Formula (P) falls within the range of $δ \geq 0$, and which is free from the deficiency in A site element. However, in the ferroelectric film containing the perovskite type oxide in accordance with the present invention, there may be present the A site deficiency within a range such that the adverse effect on the characteristics may not occur markedly.

In accordance with the present invention, it is possible to provide the ferroelectric film having the film structure containing the plurality of the pillar-shaped crystals. With the sol-gel technique described in Japanese Unexamined Patent Publication No. 2006-096647, the film structure containing the plurality of the pillar-shaped crystals is not capable of being obtained. With the film structure containing the plurality of the pillar-shaped crystals, each of which extends in a direction nonparallel with respect to a substrate surface, it is possible to obtain an orientational film, in which the crystal orientation is uniform. With the film structure containing the plurality of the pillar-shaped crystals, each of which extends in a direction nonparallel with respect to a substrate surface, it is possible to obtain high piezoelectric performance.

Examples of piezoelectric strains include the following:
(1) an ordinary electric field-induced piezoelectric strain of the ferroelectric substance, which strain is caused by the increase and decrease in applied electric field to undergo the expansion and contraction in the direction of the electric field application in cases where a vector component of a spontaneous polarization axis and the direction of the electric field application coincide with each other,
(2) a piezoelectric strain, which is caused to occur when the polarization axis is reversibly rotated by an angle different from 180° due to the increase and decrease in applied electric field,
(3) a piezoelectric strain, which is caused to occur in cases where the crystal is caused by the increase and decrease in applied electric field to undergo phase transition, and a volume change occurring due to the phase transition of the crystal is utilized, and
(4) a piezoelectric strain, which is caused to occur by the utilization of an engineered domain effect, wherein a large strain is capable of being obtained in cases where a material having characteristics, such that the material is caused by electric field application to undergo phase transition, is utilized, and in cases where a crystal orientation structure is set so as to contain a ferroelectric phase having the crystal orientational characteristics in the direction different from the direction of the spontaneous polarization axis (in cases where the engineered domain effect is utilized, the actuation may be carried out under the conditions under which the phase transition may occur, or under the conditions such that the phase transition may not occur).

In cases where each of the piezoelectric strains (1), (2), (3), and (4) described above is utilized alone, or two or more kinds of the piezoelectric strains (1), (2), (3), and (4) described above are utilized in combination, a desired level of the piezoelectric strain is capable of being obtained. Also, as for each of the piezoelectric strains (1), (2), (3), and (4) described above, in cases where the crystal orientation structure in accordance with the principle of the strain generation corresponding to the piezoelectric strain is employed, an enhanced level of the piezoelectric strain is capable of being obtained. Therefore, in order for high piezoelectric performance to be obtained, the ferroelectric film should preferably have the crystal orientational characteristics. For example, in the cases of the PZT type ferroelectric film, which has the MPB composition, a pillar-shaped crystal film having the (100) orientation is capable of being obtained.

It is sufficient for the direction of growth of the pillar-shaped crystals to be nonparallel with respect to the substrate surface. For example, the direction of growth of the pillar-shaped crystals may be approximately normal to the substrate surface. Alternatively, the direction of growth of the pillar-shaped crystals may be oblique with respect to the substrate surface.

The mean pillar diameter of the plurality of the pillar-shaped crystals, which constitute the ferroelectric film, is not limited and should preferably fall within the range of 30 nm to 1 μm. If the mean pillar diameter of the pillar-shaped crystals is markedly small, there will be the risk that the crystal growth sufficient for the ferroelectric substance will not arise, and that the desired ferroelectric performance (piezoelectric performance) will not be capable of being obtained. If the mean pillar diameter of the pillar-shaped crystals is markedly large, there will be the risk that the shape accuracy after patterning processing has been performed will become low.

In accordance with the present invention, it is possible to provide the ferroelectric film, which contains the perovskite type oxide represented by Formula (P), and which has a film thickness of at least 3.0 μm.

As described above, the present invention provides the ferroelectric film containing the perovskite type oxide, which is of the PZT type, and which has been doped with the donor ions in a doping concentration falling within the range of 5 mol % to 40 mol % at the A site, the ferroelectric film containing the perovskite type oxide being capable of being formed with the process wherein the sintering auxiliary or the acceptor ions need not be doped. The ferroelectric film containing the perovskite type oxide in accordance with the present invention, which has been doped with the donor ions in the high doping concentration falling within the range of 5 mol % to 40 mol % at the A site, has good ferroelectric performance (good piezoelectric performance). With the ferroelectric film containing the perovskite type oxide in accordance with the present invention, wherein the sintering auxiliary or the acceptor ions need not be doped, and wherein the donor ions are capable of being doped in the high doping concentration described above at the A site, the lowering of the ferroelectric performance due to the sintering auxiliary or the acceptor ions is capable of being suppressed, and the enhancement of the ferroelectric performance by the doping with the donor ions is capable of being derived sufficiently.

[Process for Forming a Ferroelectric Film]

The ferroelectric film in accordance with the present invention containing the perovskite type oxide that is represented by Formula (P), which perovskite type oxide has been doped with the donor ions M in the doping concentration falling within the range of 5 mol % to 40 mol % at the A site, is capable of being formed by the sputtering technique, which is the non-thermal-equilibrium processing. Examples of the film formation techniques appropriate for the ferroelectric film in accordance with the present invention include the sputtering technique, a plasma enhanced chemical vapor deposition technique (a plasma enhanced CVD technique), a firing quenching technique, an annealing quenching technique, and a flame spraying quenching technique. As the film formation technique for the ferroelectric film in accordance with the present invention, the sputtering technique is particularly preferable.

With the thermal-equilibrium processing, such as the sol-gel technique, it is not always possible to dope a dopant, which primarily has a mismatching valence number, in a high doping concentration, and it is necessary to contrive to utilize, for example, the sintering auxiliary or the acceptor ions. However, with the non-thermal-equilibrium processing, the contrivance as described above is not necessary, and the donor ions are capable of being doped in a high doping concentration.

In cases where the ferroelectric substance film in accordance with the present invention is formed by the sputtering technique, though not limited in particular, the sputtering apparatus should preferably be constituted such that the sputtering apparatus is provided with the shield, which surrounds the outer periphery of a target holder on the film formation substrate side, and such that the state of the potential of the plasma space is capable of being adjusted by the presence of the shield. (Reference may be made to Japanese Patent Application No. 2006-263981, which has been previously filed by the inventors, and which has not yet been published at the time of the filing of the present application.)

Figure 1B:
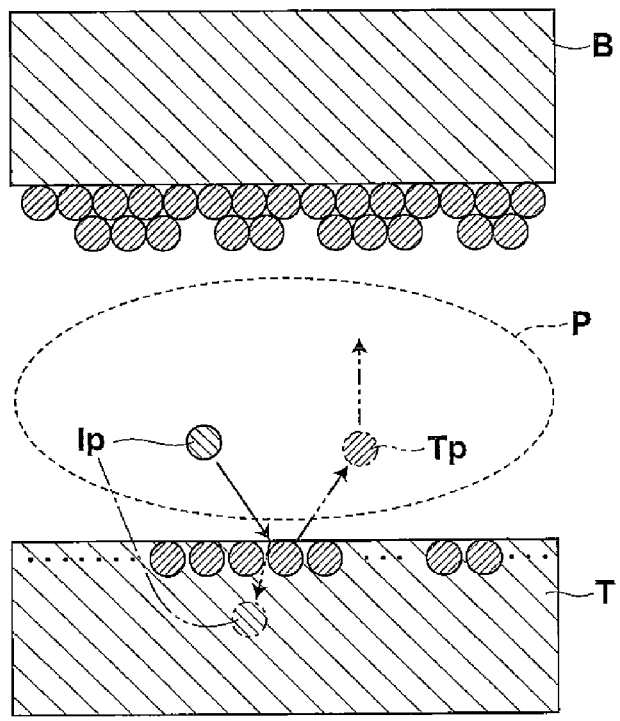
FIG. 1B is an explanatory view showing how a film is formed.

An example of a sputtering apparatus and how a film is formed will be described hereinbelow with reference to FIGS. 1A and 1B and FIG. 2. An RF sputtering apparatus, which utilizes an RF electric power source, is herein taken as an example. However, it is also possible to employ a DC sputtering apparatus, which utilizes a DC electric power source. FIG. 1A is a schematic sectional view showing a film forming apparatus (a sputtering apparatus) employed in this embodiment. FIG. 1B is an explanatory view showing how a film is formed. FIG. 2 is an enlarged view showing a shield and its vicinity in FIG. 1A.

As illustrated in FIG. 1A, a film forming apparatus 200 is approximately constituted of a vacuum chamber 210, in which a substrate holder 11, such as an electrostatic chuck, and a plasma electrode (a cathode electrode) 12 are provided. The substrate holder 11 is capable of supporting a substrate (a film formation substrate) B and heating the substrate B to a predetermined temperature. The plasma electrode 12 acts to generate plasma. The plasma electrode 12 corresponds to the target holder for supporting a target T.

The substrate holder 11 and the plasma electrode 12 are located at a spacing from each other so as to stand Lacing each other. Also, a target T, which has a composition in accordance with the composition of the film to be formed, is located on the plasma electrode 12. The plasma electrode 12 is connected to a radio frequency electric power source 13. The plasma electrode 12 and the radio frequency electric power source 13 together constitute a plasma forming section. In this embodiment, the film forming apparatus 200 is provided with a shield 150, which surrounds the outer periphery of the target T on the film formation substrate side. This constitution may be expressed such that the film forming apparatus 200 is provided with the shield 150, which surrounds the outer periphery of the plasma electrode 12 for supporting the target T, i.e., the outer periphery of the target holder, on the film formation substrate side.

The vacuum chamber 210 is provided with a gas introducing aperture 214, through which a gas (film formation gas) G necessary for the film formation is to be introduced into the vacuum chamber 210. The vacuum chamber 210 is also provided with a gas exhaust pipe 15, through which an exhaust gas V is to be taken out from the vacuum chamber 210. The gas introducing aperture 214, through which the gas G is to be introduced into the vacuum chamber 210, is located on the side opposite to the gas exhaust pipe 15 and at the height approximately identical with the height of the shield 250.

As the gas G, an Ar gas, an $Ar/O_2$ mixed gas, or the like, is utilized. As illustrated in FIG. 1B, the gas G having been introduced into the vacuum chamber 210 is converted into the plasma by electrical discharge of the plasma electrode 12, and a plus ion Ip, such as an Ar ion, is thereby produced. The plus ion Ip having thus been produced sputters the target T. A constituent element Tp of the target T having thus been sputtered by the plus ion Ip is released from the target T and is deposited on the substrate B in a neutral state or in an ionized state. In FIG. 1B, a reference letter P represents a plasma space.

The potential of the plasma space P constitutes the plasma potential Vs (V). Ordinarily, the substrate B is an electrical insulator and is electrically isolated from the ground. Therefore, the substrate B is in a floating state, and the potential of the substrate B constitutes the floating potential Vf (V). It is considered that the constituent element Tp of the target T, which constituent element is located between the target T and the substrate B, collides with the substrate B during the film formation by having kinetic energy corresponding to acceleration voltage of the potential difference Vs–Vf between the potential of the plasma space P and the potential of the substrate B.

Figure 3:
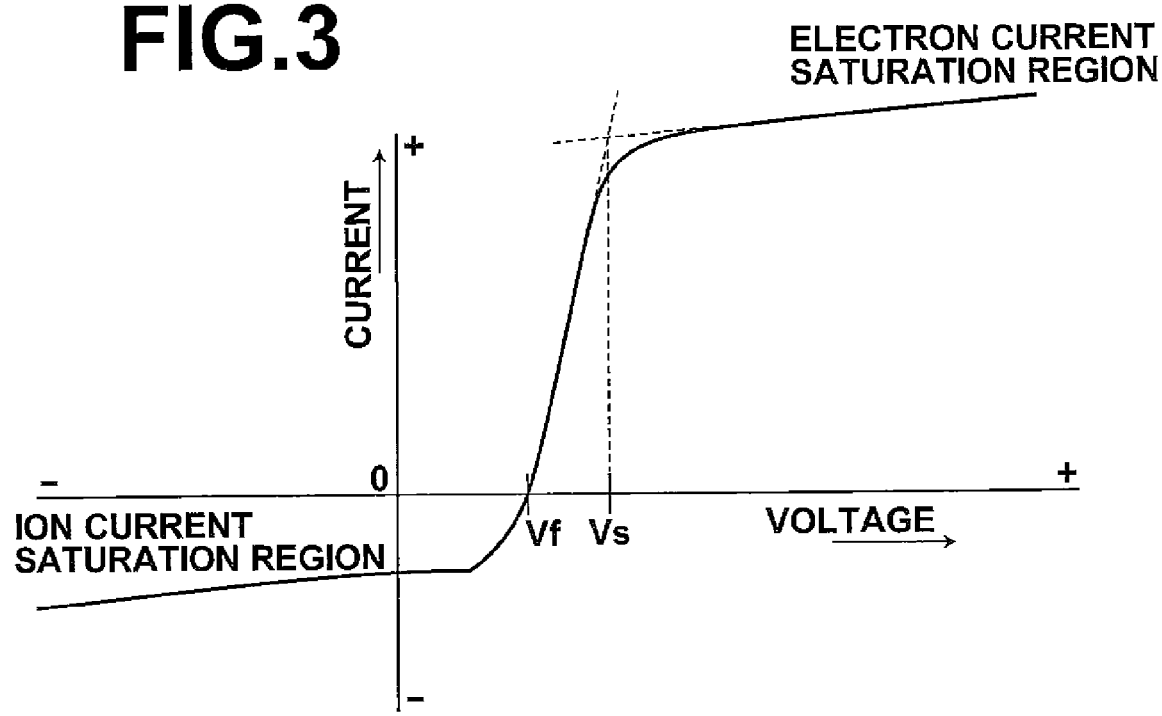
FIG. 3 is an explanatory view showing how a plasma potential Vs and a floating potential Vf are measured.

The plasma potential Vs and the floating potential Vf are capable of being measured by use of the Langmuir probe. In cases where the end of the Langmuir probe is inserted into the plasma P, and the voltage applied to the probe is altered, current-voltage characteristics as illustrated in, for example, FIG. 3, are obtained. (Reference may be made to "Fundamentals of Plasma and Film Formation," Mitsuharu Konuma, p. 90, published by Nikkan Kogyo Shinbun-sha.) In FIG. 3, the probe potential, at which the current becomes equal to zero, is the floating potential Vt. In this state, the quantities of the ion current and the electron current flowing into the probe surface become equal to each other. A metal surface and the substrate surface in the electrically isolated state are set at the floating potential Vf. In cases where the probe voltage is successively set at values higher than the floating potential Vf, the ion current decreases successively, and only the electron current reaches the probe. The voltage at the boundary is the plasma potential Vs.

As described above, the difference Vs–Vf has the correlation with the kinetic energy of the constituent element Tp of the target T, which constituent element collides with the substrate B. Ordinarily, as represented by the formula shown below, the kinetic energy E may be represented by a function of the temperature T. Therefore, it is considered that the difference Vs–Vf has the effects identical with the effects of the temperature upon the substrate B.

$$E = 1/2\, mv^2 = 3/2\, kT$$

wherein m represents the mass, v represents the velocity, k represents the constant, and T represents the absolute temperature.

It is considered that, besides the effects identical with the effects of the temperature, the difference Vs–Vf also has the effects of promoting the surface migration, the effects of etching the weak binding regions, and the like.

The vacuum chamber 210 illustrated in FIG. 1A is characterized by the provision of the shield 250, which is located within the vacuum chamber 210 so as to surround the outer periphery of the target T on the film formation substrate side. The shield 250 is located on a ground shield, i.e., a grounding member 202, so as to surround the outer periphery of the target T on the film formation substrate side. The grounding member 202 stands on a bottom surface 210a of the vacuum chamber 210 so as to surround the plasma electrode 12. The grounding member 202 acts to prevent electrical discharge from the plasma electrode 12 laterally or downwardly toward the vacuum chamber 210.

By way of example, as illustrated in FIG. 1A and FIG. 2, the shield 250 is provided with a plurality of annular metal plates, i.e., rings (or fins or shielding layers) 250a, 250a, . . . . In the example illustrated in FIG. 1A and FIG. 2, the shield 250 is provided with four sheets of the rings 250a, 250a, . . . , and a plurality of electrically conductive spacers 250b, 250b, . . . are located between the adjacent rings 250a, 250a. The plurality of the spacers 250b, 250b, . . . are located at intervals along the circumferential direction of each of the rings 250a, 250a, . . . so as to form a space 204 between the adjacent rings 250a, 250a, such that the gas G is capable of flowing easily through the space 204. From the view point described above, a plurality of the spacers 250b, 250b, . . . should preferably be located also between the grounding member 202 and the ring 250a that is located just above the grounding member 202.

With the constitution described above, the shield 250 is electrically connected with the grounding member 202 and is thus grounded. No limitation is imposed upon the materials of the rings 250a, 250a, . . . , and the spacers 250b, 250b, . . . . However, the rings 250a, 250a, . . . , and the spacers 250b, 250b, . . . should preferably be made from stainless steel (SUS), or the like.

The constitution described above may be modified such that electrical connection members (not shown) for electrically connecting the plurality of the rings 250a, 250a, . . . with one another are fitted to the outer periphery side of the shield 250. The rings 250a, 250a, . . . of the shield 250 are electrically connected with one another by the electrically conductive spacers 250b, 250b, . . . and are thus capable of being grounded. However, in cases where the electrical connection members (not shown) described above are fitted to the outer periphery side of the shield 250, the plurality of the rings 250a, 250a, . . . of the shield 250 are capable of being grounded reliably.

As described above, the shield 250 is located so as to surround the outer periphery of the target T on the film formation substrate side. Therefore, a grounding potential is formed by the shield 250 at the outer periphery of the target T on the film formation substrate side.

With the film forming apparatus 200, the plasma conditions are capable of being adjusted and optimized by the shield 250 having the constitution described above, and the difference Vs–Vf (V), which is the difference between the plasma potential Vs (V) and the floating potential Vf (V), is capable of being adjusted and optimized by the shield 250. The aforesaid effects of the shield 250 are considered as described below.

Specifically, in cases where the voltage of the radio frequency electric power source 13 is applied to the plasma electrode 12 in order for the film to be formed on the substrate B, the plasma is formed above the target T, and electrical discharge occurs between the shield 250 and the target T. It is considered that, due to the thus occurring electrical discharge, the plasma is confined within the region defined by the shield 250, the plasma potential Vs (V) is caused to become low, and the difference Vs−Vf (V), which is the difference between the plasma potential Vs (V) and the floating potential Vf (V), is thus caused to become low. In cases where the difference Vs−Vf (V), which is the difference between the plasma potential Vs (V) and the floating potential Vf (V), becomes low, the level of energy, with which the constituent element Tp of the target T having been released from the target T collides with the substrate B, becomes low. By the optimization of the difference Vs−Vf (V), which is the difference between the plasma potential Vs (V) and the floating potential Vf (V), particle energy of the constituent element Tp of the target T is capable of being optimized, and a film having good quality is capable of being formed.

Figure 7:
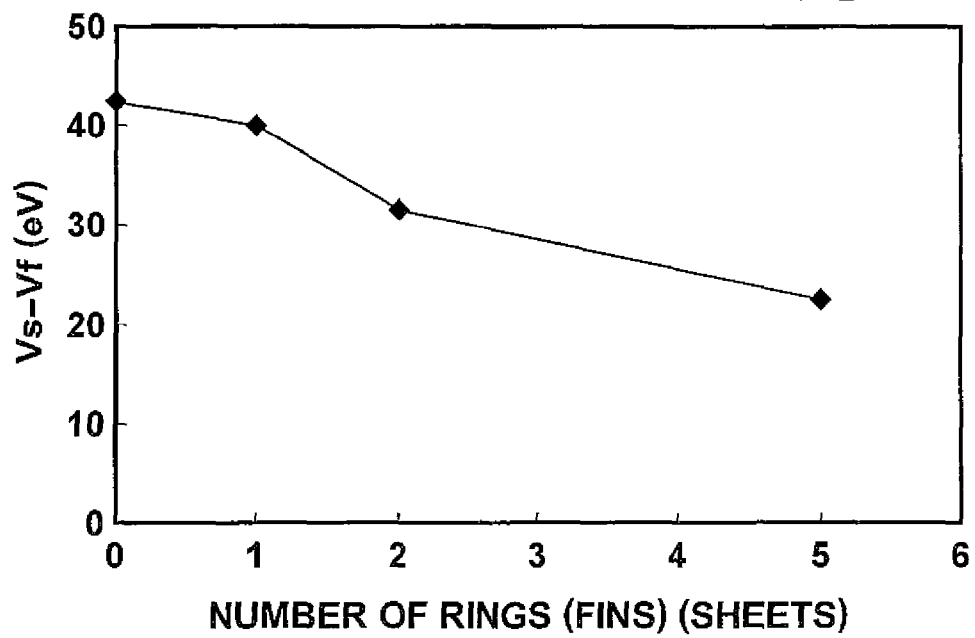
FIG. 7 is a graph showing results of measurement made in Example 1 (i.e., relationship between the number of sheets of rings and the difference between the plasma potential and the floating potential)

In cases where the number of sheets of the rings 250, 250, ... becomes large, and the height of the entire shield 250 thus becomes large, there is a tendency for the difference Vs−Vf (V), which is the difference between the plasma potential Vs (V) and the floating potential Vf (V), to become small. (Reference may be made to FIG. 7 showing the results of measurement made in Example 1.) The aforesaid tendency will arise presumably since, as the height of the entire shield 250 becomes large, the electrical discharge between the shield 250 and the target T becomes strong, and the difference Vs−Vf (V), which is the difference between the plasma potential Vs (V) and the floating potential Vf (V), becomes small.

With respect to a specific film formation temperature, the value of the difference Vs−Vf (V) most appropriate as the film formation conditions is capable of being obtained. In order for the most appropriate potential difference to be obtained, it is possible to make an adjustment for obtaining the desired potential difference by an increase or a decrease in number of sheets of the rings 250a, 250a, ... without the film formation temperature being altered. Since the rings 250a, 250a, ... have been superposed as the shielding layers one upon another via the spacers 250b, 250b, ... , the rings 250a, 250a, ... are capable of being taken out, and the number of the sheets of the rings 250a, 250a, ... is thereby capable of being altered.

The ring 250a, which is located at the bottom end of the shield 250, is located at a spacing from the outer periphery of the target T. If the linear distance of the spacing between the target T and the shield 250 is zero, the electrical discharge will not occur. Also, if the linear distance of the spacing between the target T and the shield 250 is markedly long, the effects of the shield 250 will become small. Therefore, in order for the effects of the shield 250 to be obtained efficiently, the spacing distance between the target T and the shield 250 should preferably fall within the range of approximately 1 mm to approximately 30 mm.

The constituent element Tp of the target T having been released from the target T is deposited on the substrate B and is also deposited on the rings 250a, 250a, ... of the shield 250 located around the target T. As for the deposition on the rings 250a, 250a, ... of the shield 250, the constituent element Tp of the target T is deposited predominantly on an inner peripheral edge 251 of each of the rings 250a, 250a, ..., which inner peripheral edge 251 stands facing the target T, and on the regions in the vicinity of the inner peripheral edge 251. The state of the deposition is illustrated in FIG. 2. As illustrated in FIG. 2, particles (deposition particles) of the constituent element Tp are deposited to form a film 253 on the inner peripheral edge 251 of each of the rings 250a, 250a, ... and the top and bottom surfaces of the part of each ring 250a in the vicinity of the inner peripheral edge 251. If the film 253 is formed over the entire surface of each of the rings 250a, 250a, ... , the functions of the shield 250 for the grounding potential will be lost. Therefore, the shield 250 should preferably be constituted such that the film 253 may not be formed as much as possible.

With the film forming apparatus 200, the shield 250 is provided with the plurality of the rings 250a, 250a, ..., which are superposed one upon another at intervals with respect to the direction of the superposition, such that the space 204 may intervene between the adjacent rings 250a, 250a. Therefore, the problems are capable of being prevented from occurring in that the deposition particles of the constituent element Tp having been released from the target T are deposited on the entire area of the shield 250, and in that the state of the potential of the shield 250 is thus caused to alter. Accordingly, in cases where the film formation is iterated, the shield 250 is capable of functioning reliably, and the difference Vs−Vf (V) between the plasma potential Vs (V) and the floating potential Vf (V) is capable of being kept reliably.

Particularly, a thickness L of the wall material of the shield 250, which thickness is taken in the direction normal to the direction of the superposition of the rings 250a, 250a, ... acting as the shielding layers, and a distance S between the rings 250a, 250a, which are adjacent to each other with respect to the direction of the superposition, i.e. the distance S between the adjacent shielding layers, should preferably have the relationship expressed as $L \geqq S$. The relationship described above has the effects such that the thickness L of the wall material of the shield 250 may be set to be large within a predetermined range with respect to the distance S between the adjacent rings 250a, 250a, and such that the film 253 may not be apt to be deposited over the entire area of each of the rings 250a, 250a, .... Specifically, in cases where the depth of each of the rings 250a, 250a, ..., which depth is taken in the direction of the movement of the deposition particles, is thus set to be large, the constituent element Tp is not capable of easily entering toward the outer periphery side of the space 204, and the problems are capable of being prevented from occurring in that the shield 250 quickly loses its functions.

It is expected that the space 204 also has other effects. Specifically, since the space 204 fulfils the roles as the path for the film formation gas C, the film formation gas G is capable of passing through the space 204 of the shield 250 and is thus capable of easily arriving at the plasma space in the vicinity of the target T. Therefore, the gas ion having been converted into the plasma in the vicinity of the target T is capable of easily arriving at the target T and is capable of efficiently causing the constituent element Tp of the target T to be released from the target T. As a result, the film having good quality and the desired characteristics is capable of being formed reliably.

As in the cases of a shield free from the space, the shield 250 having the space 204 forms a wall of the equal potential on the inner periphery side. Therefore, the shield 250 having the space 204 has the effects of adjusting the difference Vs−Vf (V), which effects are of the level equivalent to the level of the effects of the shield free from the space.

With the film forming apparatus 200, the difference Vs−Vf (V) is capable of being controlled by the adjustment of the height of the shield 250. The difference Vs−Vf (V) is also capable of being adjusted by an alteration of the electric power applied to the target T, the film formation pressure, or the like. However, in cases where the difference Vs–Vf (V) is controlled by the alteration of the electric power applied to the target T, the film formation pressure, or the like, the problems often occur in that a different parameter, such as the film formation rate, alters, and therefore the desired film quality is not capable of being obtained. Experiments conducted under certain conditions by the inventors have revealed that, in cases where the electric power applied to the target T is altered from 700 W to 300 W, though the difference Vs–Vf (V) is capable of being lowered from 38 eV to 25 eV, the film formation rate becomes low from 4 μm/h to 2 μm/h. With this embodiment of the film forming apparatus 200, the difference Vs–Vf (V) is capable of being adjusted without a different parameter, such as the film formation rate, being altered. Therefore, with this embodiment of the film forming apparatus 200, the film formation conditions are capable of being optimized easily, and the film having good quality is capable of being formed reliably.

Also, with respect to the film formation of the piezoelectric film, such as the PZT type ferroelectric film, the inventors have found that the film formation should preferably be performed under the film formation conditions such that the difference Vs–Vf (V) between the plasma potential Vs (V) and the floating potential Vf (V) is equal to at most 35 eV, and such that the temperature of the substrate B is equal to at least 400° C. In cases where the height of the shield 250 in the film forming apparatus 200 and the temperature of the substrate B are adjusted such that the film formation may be performed under the film formation conditions described above, the perovskite crystal containing little pyrochlore phase is capable of being caused to grow reliably, the occurrence of the Pb deficiency is capable of being suppressed reliably, and the ferroelectric film having good quality, which has a good crystal structure and a good film composition, is capable of being formed reliably.

As for the film formation of the PZT type ferroelectric film by the sputtering technique, it has been known that, in cases where the film formation is performed at a high temperature, the Pb deficiency is apt to occur. The inventors have found that, besides the film formation temperature, the occurrence of the Pb deficiency also depends upon the difference Vs–Vf. Of Pb, Zr, and Ti, which are the constituent elements of PZT, Pb exhibits the highest sputtering rate and is apt to be sputtered. For example, in Table 8.1.7 of "Vacuum Handbook," edited by ULVAC, Inc., published by Ohmsha, Ltd., it is described that the sputtering rates under the conditions of Ar ion 300 ev are such that Pb=0.75, Zr=0.48, and Ti=0.65. The characteristics such that the element is apt to be sputtered represent that the atom is apt to be re-sputtered after the atom has been deposited on the substrate surface. It is considered that, as the difference between the plasma potential and the potential of the substrate becomes large, i.e. as the difference Vs–Vf becomes large, the re-sputtering rate becomes high, and the Pb deficiency becomes apt to occur.

Under the conditions such that both the film formation temperature Ts and the difference Vs–Vf take markedly small values, there is a tendency that the perovskite crystal is not capable of being caused to grow appropriately. Also, under the conditions such that at least either one of the film formation temperature Ts and the difference Vs–Vf takes a markedly large value, there is a tendency for the Pb deficiency to occur readily.

Specifically, under the film formation conditions of Ts (° C.)≧400, in cases where the film formation temperature Ts is comparatively low, it is necessary for the difference Vs–Vf to be set at a comparatively large value, such that the perovskite crystal may be caused to grow appropriately. Also, under the film formation conditions of Ts (° C)≧400, in cases where the film formation temperature Ts is comparatively high, it is necessary for the difference Vs–Vf to be set at a comparatively small value, such that the occurrence of the Pb deficiency may be suppressed.

[Ferroelectric Device (Piezoelectric Device) and Ink Jet Type Recording Head]

Figure 4:
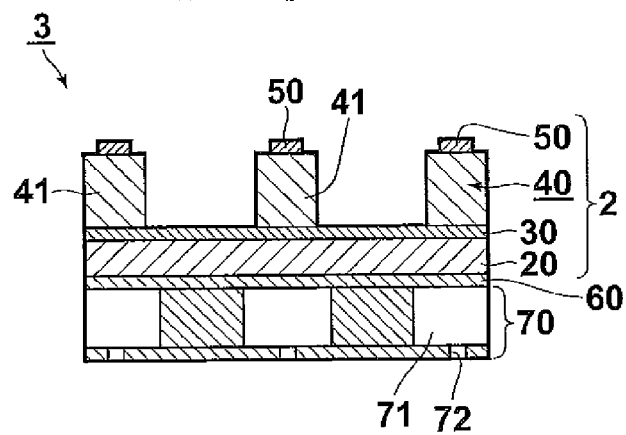
FIG. 4 is a sectional view showing an embodiment of a piezoelectric device (acting as the ferroelectric device) in accordance with the present invention and an ink jet type recording head (acting as the liquid discharge apparatus) provided with the embodiment of the piezoelectric device.

An embodiment of the piezoelectric device (ferroelectric device) in accordance with the present invention and an ink jet type recording head (acting as the liquid discharge apparatus in accordance with the present invention), which is provided with the embodiment of the piezoelectric device in accordance with the present invention, will be described hereinbelow with reference to FIG. 4. FIG. 4 is a sectional view showing a major part of an ink jet type recording head (acting as a liquid discharge apparatus), which is provided with an embodiment of the piezoelectric device in accordance with the present invention. In FIG. 4, for clearness, reduced scales of constituent elements of the ink jet type recording head are varied from actual reduced scales.

With reference to FIG. 4, a piezoelectric device (a ferroelectric device) 2 comprises a substrate 20. The piezoelectric device 2 also comprises a bottom electrode 30, a ferroelectric film (a piezoelectric film) 40, and top electrodes 50, 50, . . . , which are overlaid in this order on a surface of the substrate 20. An electric field is capable of being applied by the bottom electrode 30 and each of the top electrodes 50, 50, . . . in the thickness direction of the ferroelectric film 40. The ferroelectric film 40 is constituted of the ferroelectric film in accordance with the present invention, which contains the perovskite type oxide represented by Formula (P) shown above in accordance with the present invention.

The bottom electrode 30 is formed over approximately the entire area of the surface of the substrate 20. Also, the ferroelectric film 40 is formed on the bottom plate 30. The ferroelectric film 40 has a pattern comprising line-like protruding areas 41, 41, . . . , which extend along a line normal to the plane of the sheet of FIG. 3 and are arrayed in a striped pattern. Each of the top electrodes 50, 50, . . . is formed on one of the protruding areas 41, 41, . . . .

The pattern of the ferroelectric film 40 is not limited to the one illustrated in FIG. 4 and may be designed arbitrarily. Also, the ferroelectric film 40 may be formed as a continuous film. However, in cases where the ferroelectric film 40 is not formed as a continuous film and is formed in the pattern comprising the plurality of the protruding areas 41, 41, . . . separated from one another, the expansion and the contraction of each of the protruding areas 41, 41, . . . are capable of occurring smoothly, and therefore a large displacement quantity is capable of being obtained. Accordingly, the ferroelectric film 40 should preferably be formed in the pattern comprising the plurality of the protruding areas 41, 41, . . . separated from one another.

No limitation is imposed upon a material of the substrate 20. Examples of the materials of the substrate 20 include silicon, glass, stainless steel (SUS), yttrium stabilized zirconia (YSZ), alumina, sapphire, and silicon carbide. The substrate 20 may also be constituted of a laminate substrate, such as an SOI substrate, which contains an $SiO_2$ oxide film having been formed on a surface of a silicon substrate.

No limitation is imposed upon a principal constituent of the bottom electrode 30. Examples of the principal constituents of the bottom electrode 30 include metals, such as Au, Pt, and Ir; metal oxides, such as $IrO_2$, $RuO_2$, $LaNiO_3$, and $SrRuO_3$; and combinations of the above-enumerated metals and/or the above-enumerated metal oxides.

Also, no limitation is imposed upon a principal constituent of the top electrodes 50, 50, . . . . Examples of the principal constituents of the top electrodes 50, 50, . . . include the materials exemplified above for the bottom electrode 30; electrode materials ordinarily utilized in semiconductor processes, such as Al, Ta, Cr, and Cu; and combinations of the materials exemplified above for the bottom electrode 30 and/or the above-enumerated electrode materials.

No limitation is imposed upon the thickness of the bottom electrode 30 and the thickness of each of the top electrodes 50, 50, . . . . For example, the thickness of the bottom electrode 30 and the thickness of each of the top electrodes 50, 50, . . . may be approximately 200 nm. Also, no limitation is imposed upon the thickness of the ferroelectric film 40. The thickness of the ferroelectric film 40 may ordinarily be at least 1 μm and may fall within the range of, for example, 1 μm to 5 μm. The thickness of the ferroelectric film 40 should preferably be at least 3 μm.

An ink jet type recording head (acting as the liquid discharge apparatus in accordance with the present invention) 3 approximately has a constitution, in which a vibrating plate 60 is secured to a bottom surface of the substrate 20 of the piezoelectric device 2 having the constitution described above, and in which an ink nozzle (acting as the liquid storing and discharging member) 70 is secured to the bottom surface of the vibrating plate 60. The ink nozzle 70 comprises a plurality of ink chambers (acting as the liquid storing chambers) 71, 71, . . ., in which ink is to be stored. The ink nozzle 70 also comprises a plurality of ink discharge openings (acting as the liquid discharge openings) 72, 72, . . ., through which the ink is to be discharged from the ink chambers 71, 71, . . . to the exterior of the ink chambers 71, 71, . . . The plurality of the ink chambers 71, 71, . . . are located in accordance with the number and the pattern of the protruding areas 41, 41, . . . of the ferroelectric film 40.

The ink jet type recording head 3 is constituted such that each of the protruding areas 41, 41, . . . of the piezoelectric device 2 is expanded or contracted through alteration of the electric field applied across each of the protruding areas 41, 41, . . . of the piezoelectric device 2, and such that the discharge of the ink from each of the ink chambers 71, 71, . . . and the quantity of the ink discharged from each of the ink chambers 71, 71, . . . are thereby controlled.

In lieu of the vibrating plate 60 and the ink nozzle 70 being secured as the independent members to the substrate 20, a part of the substrate 20 may be processed to form the vibrating plate 60 and the ink nozzle 70. For example, in cases where the substrate 20 is constituted of the laminate substrate, such as the SOI substrate, etching processing may be performed on the substrate 20 from the rear surface side of the substrate 20 in order to form the ink chamber 71, and the vibrating plate 60 and the ink nozzle 70 may be formed with processing of the substrate 20.

The embodiment of the piezoelectric device 2 and the ink jet type recording head 3 are constituted in the manner described above.

[Ink Jet Type Recording System]

Figure 5:
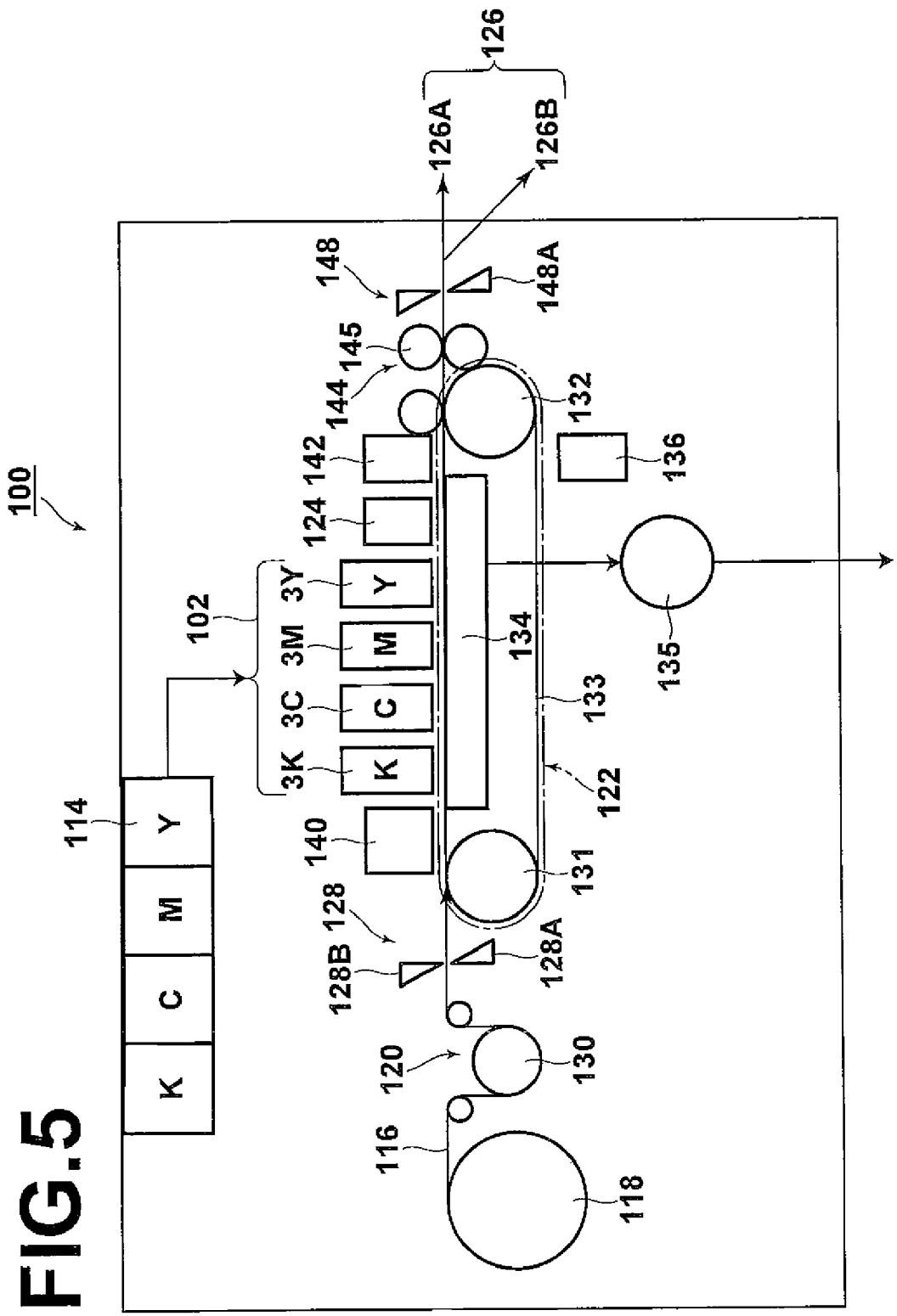
FIG. 5 is a schematic view showing an example of an ink jet type recording system, in which the ink jet type recording head of FIG. 4 is employed.
Figure 6:
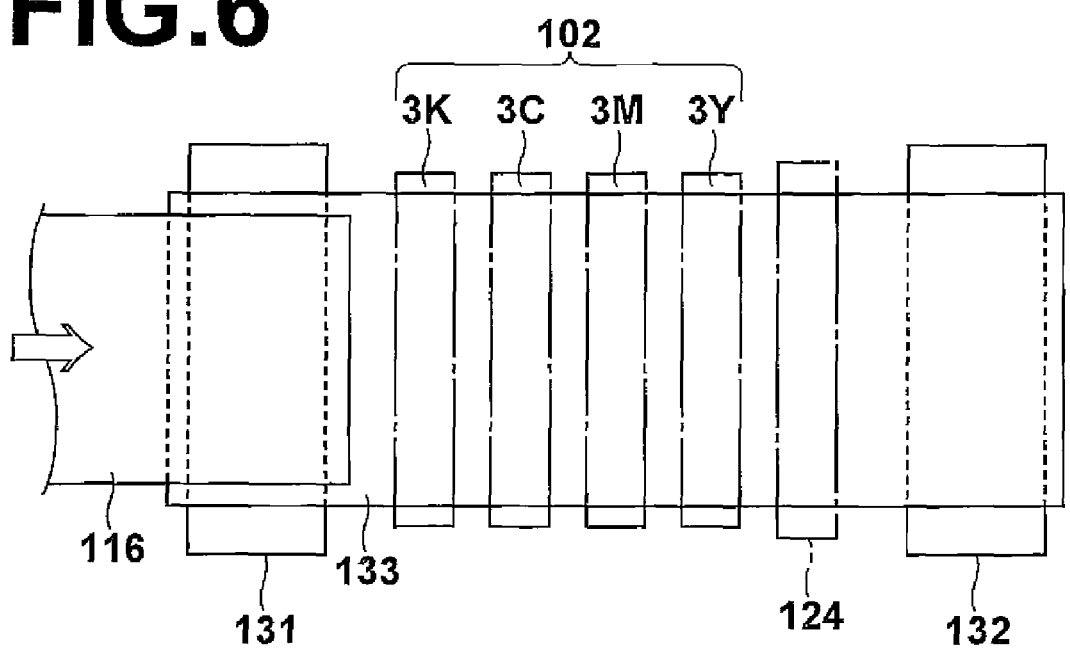
FIG. 6 is a plan view showing a part of the ink jet type recording system of FIG. 5.

An example of an ink jet type recording system, in which the aforesaid embodiment of the ink jet type recording head 3 of FIG. 4 is employed, will be described hereinbelow with reference to FIG. 5 and FIG. 6. FIG. 5 is a schematic view showing an example of an ink jet type recording system, in which the aforesaid embodiment of the ink jet type recording head of FIG. 4 is employed. FIG. 6 is a plan view showing a part of the ink jet type recording system of FIG. 5.

With reference to FIG. 5 and FIG. 6, an ink jet type recording system 100 comprises a printing section 102, which is provided with a plurality of ink jet type recording heads (hereinbelow referred to simply as the heads) 3K, 3C, 3M, and 3Y. Each of the heads 3K, 3C, 3M, and 3Y is utilized for one of different ink colors. The ink jet type recording system 100 also comprises an ink stocking and loading section 114 for storing ink compositions, each of which is to be furnished to one of the heads 3K, 3C, 3M, and 3Y. The ink jet type recording system 100 further comprises a paper supply section 118 for supplying recording paper 116. The ink jet type recording system 100 still further comprises a de-curling processing section 120 for eliminating roil set curl of the recording paper 116 having been received from the paper supply section 118. The ink jet type recording system 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The ink jet type recording system 100 further comprises a print detecting section 124 for reading out the results of the printing performed with the printing section 102. The ink jet type recording system 100 still further comprises a paper discharge section 126 for discharging the printed recording paper (i.e., the printed paper) to the exterior of the ink jet type recording system 100.

Each of the heads 3K, 3C, 3M, and 3Y of the printing section 102 is constituted of the aforesaid embodiment of the ink jet type recording head 3.

In the de-curling processing section 120, heat is given by a heating drum 130 to the recording paper 116 in the direction reverse to the direction of the roll set curl, and the de-curling processing is thereby performed.

As illustrated in FIG. 5, in the cases of the ink jet type recording system 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 128B is located on the side of the printing surface of the recording paper 116 with the conveyance path intervening between the stationary blade 128A and the round blade 128B. In the cases of a system utilizing cut paper sheets, the system need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 5, and the recording paper 116 having been supported on the belt 133 is thereby conveyed toward the right in FIG. 5.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 6, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 3K, 3C, 3M, and 3Y is constituted of the line type head provided with a plurality of ink discharge openings (of the nozzles), which are arrayed over a length at least longer than one side of the recording paper 116 of the maximum size to be processed by the ink jet type recording system 100.

The heads 3K, 3C, 3M, and 3Y corresponding to the ink colors are located in the order of black (K), cyan (C), magenta (M), and yellow (Y) from the upstream side with respect to the feed direction of the recording paper 116. The color ink compositions are discharged respectively from the heads 3K, 3C, 3M, and 3Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording system 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, into a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording system 100 is constituted in the manner described above.

(Design Modification)

The present invention is not limited to the embodiments described above and may be embodied in various other ways.

EXAMPLES

The present invention will further be illustrated by the following non-limitative examples.

Example 1

A commercially available sputtering apparatus was prepared. Five sheets of the rings 250a, 250a, . . . made from stainless steel (SUS), each of which had an inner diameter of 130 mm, an outer diameter of 180 mm, and a thickness of 1 mm, were set at the grounding potential and located along a side of a target T having a diameter of 120 mm in the sputtering apparatus. In this manner, the film forming apparatus as illustrated in FIG. 1A was obtained. The rings 250a, 250a, . . . were superposed one upon another such that pillar-shaped, electrically conductive spacers 250b, 250b, . . . , each of which had a diameter of 10 mm and a thickness of 5 mm, intervened between the adjacent rings 250a, 250a. Each of the spacers 250b, 250b, . . . was sufficiently smaller than the size of each of the rings 250a, 250a, . . . Therefore, the gas G having been introduced into the vacuum chamber 210 was capable of passing through the space 204 between the adjacent rings 250a, 250a without being adversely affected by the spacers 250b, 250b, . . . and was thus capable of easily arriving at the target T.

The spacing distance between the substrate B and the target T was set at 60 mm. An electric power of 700 W was applied to the radio frequency electric power source under the conditions of a vacuum degree of 0.5 Pa and in an $Ar/O_2$ mixed atmosphere ($O_2$ volume fraction: 2.5%). The plasma potential Vs, which was generated under the conditions described above, and the floating potential Vf were measured. It was found that Vs=38V, and Vf=16V (Vs−Vf=22 eV). The number of the sheets of the rings 250a, 250a, . . . was set at various different values falling within the range of 0 to four sheets, and the measurement was made in the same manner as that described above. FIG. 7 shows the relationship between the number of sheets of the rings 250a, 250a, . . . and the difference Vs–Vf (V).

In the state in which the number of the sheets of the rings 250a, 250a, . . . was zero, the difference Vs–Vf (V) was equal to Vs–Vf=43 eV. As the number of the sheets of the rings 250a, 250a, . . . was increased to one sheet, two sheets, and so on, the potential difference Vs–Vf (V) became small. In the state in which the number of the sheets of the rings 250a, 250a, . . . was two sheets, the difference Vs–Vf (V) was equal to Vs–Vf=33 eV. In the state in which the number of the sheets of the rings 250a, 250a, . . . was five sheets, the difference Vs–Vf (V) was equal to Vs–Vf=22 eV. As described above, with the RF sputtering apparatus described above, the difference Vs–Vf (V) became small in accordance with an increase of the number of the sheets of the rings 250a, 250a, . . . The difference Vs–Vf (V) was thus capable of being controlled by the alteration of the number of the sheets of the rings 250a, 250a, . . . .

As a substrate for film formation, an electrode-fitted substrate, in which a 30 nm-thick Ti close contact layer and a 300 nm-thick Ir bottom electrode had been overlaid in this order on a 25 mm-square Si substrate, was prepared. With respect to the electrode-fitted substrate having thus been prepared, film formation was performed by use of the aforesaid RF sputtering apparatus, in which the number of the sheets of the rings 250a, 250a, . . . was set at five sheets, under the same conditions as those described above. The target composition was set at various different compositions, and each of a plurality of kinds of Bi-doped PZT ferroelectric films having different Bi doping concentrations was thereby formed. In each of the target compositions, the Zr:Ti molar ratio was set to be Zr:Ti=52:48. The plasma potential Vs, which was generated at this time, and the floating potential Vf were measured. It was found that Vs=38V, and Vf=16V (Vs–Vf=22 eV).

The film formation temperature Ts was set at 450° C. The film thickness of the ferroelectric film was set at 5 µm. The Bi-doped PZT will hereinbelow be referred to as Bi-PZT.

A Pt top electrode having a thickness of 100 nm was formed on each of the aforesaid ferroelectric films by use of the sputtering technique. In this manner, each of ferroelectric devices in accordance with the present invention was obtained.

The film formation of an La-doped PZT ferroelectric film having an identical La doping concentration was performed a plurality of times in the same manner as that described above, except that the target composition was altered. With respect to each of the La-doped PZT ferroelectric films having the identical La doping concentration, the ferroelectric device was obtained. The La-doped PZT will hereinbelow be referred to as La-PZT.

The film formation of each of a plurality of kinds of Nb-doped PZT ferroelectric films having different Nb doping concentrations was performed in the same manner as that described above, except that the target composition was altered. With respect to each of the Nb-doped PZT ferroelectric films having thus been formed, the ferroelectric device was obtained. The Nb-doped PZT will hereinbelow be referred to as Nb-PZT.

The film formation of each of a plurality of kinds of Bi, Nb co-doped PZT ferroelectric films having different Bi doping concentrations and different Nb doping concentrations was performed in the same manner as that described above, except that the target composition was altered. With respect to each of the Bi, Nb co-doped PZT ferroelectric films having thus been formed, the ferroelectric device was obtained. The Bi, Nb co-doped PZT will hereinbelow be referred to as Bi, Nb-PZT.

The film formation of each of a plurality of kinds of Ta-doped PZT ferroelectric films having different Ta doping concentrations was performed in the same manner as that described above, except that the target composition was altered. With respect to each of the Ta-doped PZT ferroelectric films having thus been formed, the ferroelectric device was obtained. The Ta-doped PZT will hereinbelow be referred to as Ta-PZT.

The film formation of each of a plurality of kinds of W-doped PZT ferroelectric films having different W doping concentrations was performed in the same manner as that described above, except that the target composition was altered. With respect to each of the W-doped PZT ferroelectric films having thus been formed, the ferroelectric device was obtained. The W-doped PZT will hereinbelow be referred to as W-PZT.

In each of the target compositions, the Zr:Ti molar ratio was set to be Zr:Ti=52:48.

<EDX Measurement>

With respect to each of the plurality of kinds of the Bi-PZT ferroelectric films having the different Bi doping concentrations, a composition analysis with EDX was performed.

It was found that each of the plurality of kinds of the BI-PZT ferroelectric films having the different Bi doping concentrations had the composition, which might be represented by the formula shown below:

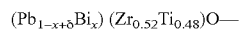

$(Pb_{1-x+\delta}Bi_x)(Zr_{0.52}Ti_{0.48})O$—

It was possible to obtain the films, wherein x=0.06, 0.10, 0.11, 0.14, 0.16, 0.21, and 0.30. Each of the films had the composition, in which 1+δ–1.02 to 1.10, and which was rich in A site element. Since a K line intensity of oxygen was low, it was found that z took a value falling within the range of approximately $2<z \leqq 3$, but the oxygen quantity z was not capable of being specified.

With respect to the other kinds of the ferroelectric films described above, the composition analysis with EDX was performed in the same manner as that described above.

<SEM Cross-Sectional Observation>

With respect to each of the plurality of kinds of the Bi-PZT ferroelectric films having the different Bi doping concentrations, SEM cross-sectional observation was performed. It was found that each of the plurality of kinds of the Bi-PZT ferroelectric films having the different Bi doping concentrations was a pillar-shaped crystal structure film containing a plurality of pillar-shaped crystals (mean pillar diameter: approximately 150 nm) having been grown in the direction approximately normal to the substrate surface.

<XRD Measurement>

With respect to each of the plurality of kinds of the Bi-PZT ferroelectric films having the different Bi doping concentrations, XRD measurement was performed.

Each of the Bi-PZT films having the Bi doping concentration falling within the range of 6 mol % to 30 mol % was the film of the perovskite single phase structure having the (100) orientation.

<PE Hysteresis Measurement>

With respect to each of the plurality of kinds of the Bi-PZT ferroelectric films having the different Bi doping concentrations ($0.06 \leqq x \leqq 0.21$), polarization-electric field hysteresis measurement (PE hysteresis measurement) was performed. Calculations were made to find a maximum polarization intensity Pmax (µC/cm²). The polarization intensity at E=100 kV/cm, at which saturation is approximately reached in polarization intensity, was taken as the maximum polarization intensity Pmax.

Figure 8:
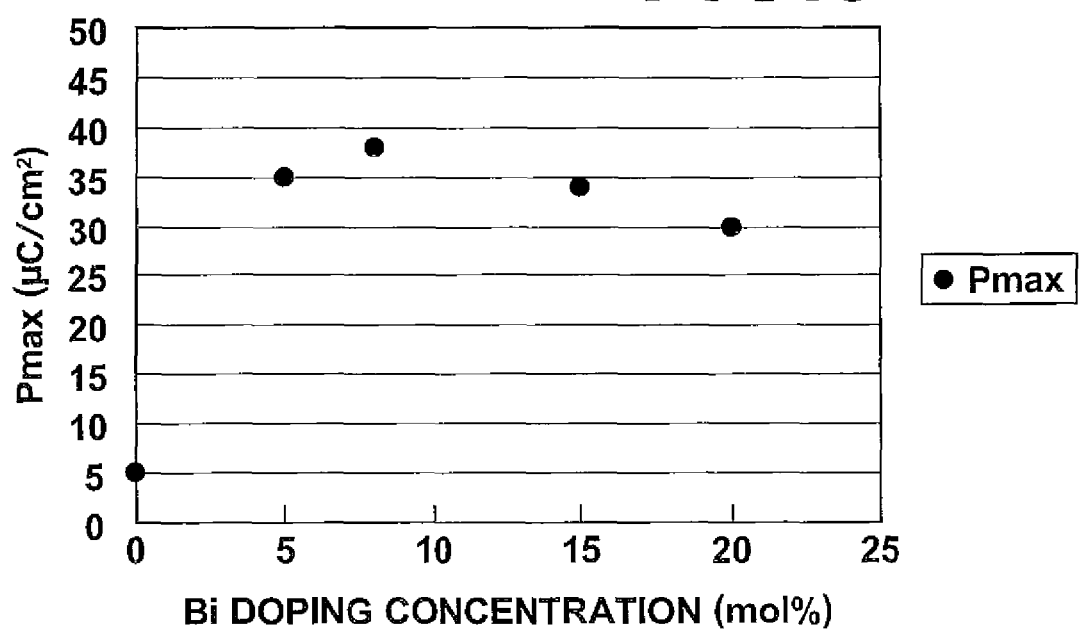
FIG. 8 is a graph showing relationship between a Bi doping concentration and a maximum polarization intensity Pmax, which relationship has been obtained with respect to each of Bi-PZT films having been formed in Example 1.

FIG. 8 is a graph showing relationship between a Bi doping concentration (a molar concentration at the A site) and a maximum polarization intensity Pmax, which relationship has been obtained with respect to each of Bi-PZT films having been formed in Example 1. As illustrated in FIG. 8, it was revealed that, in cases where the film formation was performed by use of the sputtering apparatus described above, the sintering auxiliary or the acceptor ions need not be doped, and the donor ions were capable of being doped in the doping concentration of at least 5 mol % at the A site of PZT, and that high ferroelectric performance was capable of being obtained with the doping concentration falling within the range of 5 mol % to 20 mol %.

Figure 9:
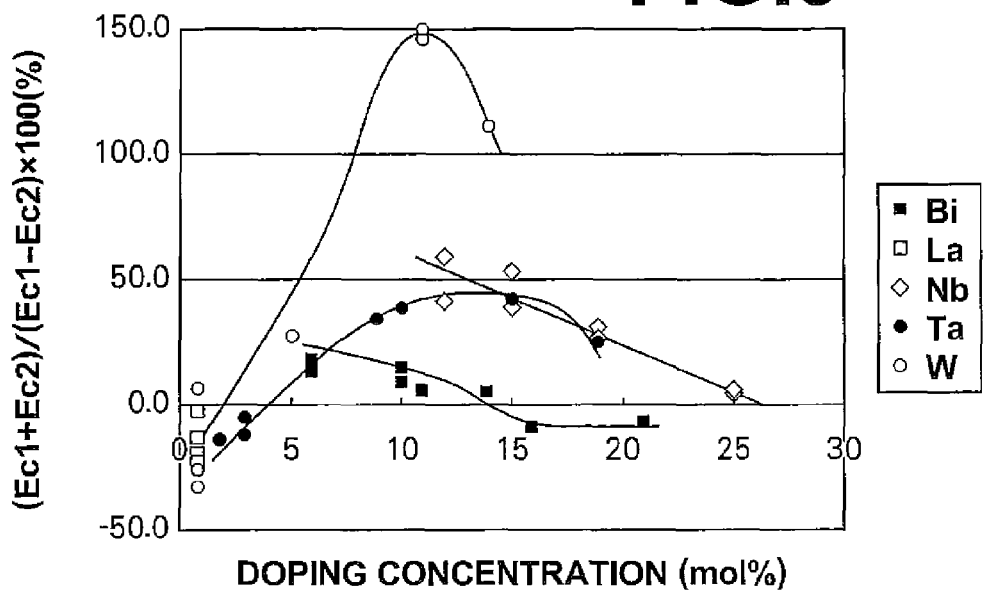
FIG. 9 is a graph showing relationships among a kind of donor ions, a donor ion doping concentration, and a value of (Ec1+Ec2)/(Ec1−Ec2)×100 (%), which relationships have been obtained with respect to various kinds of PZT type films having been formed in Example 1.
Figure 10:
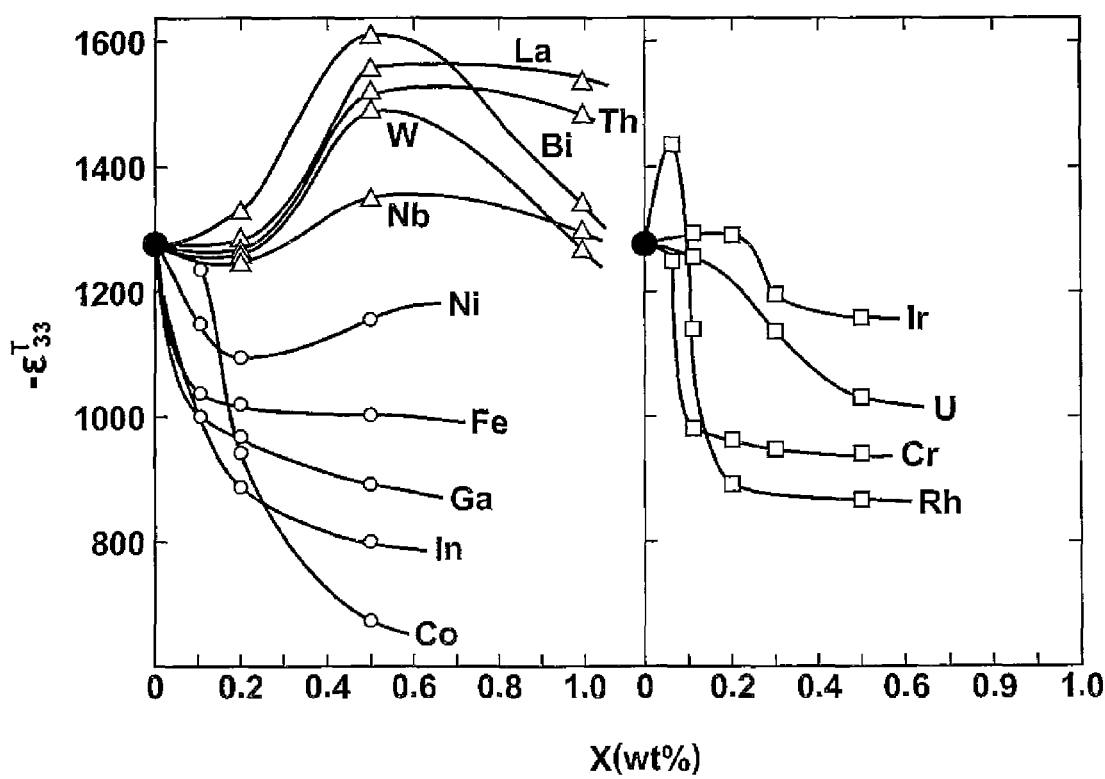
FIG. 10 is a graph illustrating FIG. 14 of "Effects of Impurity Doping in Lead Zirconate-Titanate Ceramics", S. Takahashi, Ferroelectrics, Vol. 41, pp. 143-156, 1982.

In the same manner as that for the Bi-PZT films, the PE hysteresis measurement was performed with respect to the La-PZT films, the Nb-PZT films, Ta-PZT films, and W-PZT films. Also, with respect to the various kinds of the PZT type films having been formed in Example 1, calculations were made to find relationships among a kind of donor ions, a donor ion doping concentration, and a value of (Ec1+Ec2)/(Ec1−Ec2)×100 (%). The results as illustrated in FIG. 9 were obtained.

As for each of the Nb-PZT film, the Ta-PZT film, and the W-PZT film, in which the donor ions were doped in a doping concentration of at least 5 mol % at the B site, the parameter value of (Ec1+Ec2)/(Ec1−Ec2)×100 (%) representing the level of the asymmetry of the PE hysteresis was large and exceeded 25%. As for each of the Bi-PZT film and the La-PZT film, in which the donor ions were doped at the A site, the parameter value described above was small, and good symmetry of the PE hysteresis was capable of being obtained. As for each of the Bi-PZT film, in which the Bi doping concentration fell within the range of 6 mol % to 21 mol %, and the La-PZT film, in which the La doping concentration was equal to 1 mol %, the parameter value fell within the range of (Ec1+Ec2)/(Ec1−Ec2)×100 (%)≦25.

Also, it was revealed that, as for the Bi, Nb-PZT film, in which the donor ions were doped at the A site and the B site, the asymmetry of the PE hysteresis was relieved than the PE hysteresis of the Nb-PZT film, in which the donor ions were doped only at the B site. It was further revealed that, as for the PZT film having been doped with Bi alone, the symmetry of the PE hysteresis was markedly better than the PE hysteresis of the PZT film having been co-doped with Bi and Nb.

INDUSTRIAL APPLICABILITY

The ferroelectric film in accordance with the present invention is capable of being utilized appropriately for the ferroelectric devices for piezoelectric actuators for use in ink jet type recording heads, magnetic recording and reproducing heads, micro electro-mechanical systems (MEMS) devices, micro pumps, ultrasonic probes, and the like. The ferroelectric film in accordance with the present invention is also capable of being utilized appropriately for the ferroelectric devices for ferroelectric memories, and the like.

What is claimed is:

1. A process for forming a ferroelectric film on a substrate by a sputtering technique, the ferroelectric film containing a perovskite type oxide that is represented by Formula (P) shown below,
   wherein a target, which has a composition in accordance with the film composition of the ferroelectric film to be formed, and the substrate are located at a spacing from each other,
   a shield, which surrounds an outer periphery of the target on the substrate side, is located in a non-contact state with respect to the target, the shield being provided with a plurality of shielding layers, which are superposed one upon another at intervals with respect to the direction of the superposition, and
   the ferroelectric film is formed on the substrate by the sputtering technique under conditions of a height of the shield such that a difference Vs−Vf (V) between a plasma potential Vs (V) in plasma at the time of the film formation by the sputtering technique and a floating potential Vf (V) becomes equal to at most 35V, and under conditions such that a temperature of the substrate becomes equal to at least 400° C.:

$(Pb_{1-x+\delta}M_x)(Zr_yTi_{1-y})O$— (P)

wherein M represents at least one kind of element selected from the group consisting of Bi and lanthanide elements,
   x represents a number satisfying the condition of $0.05 \leq x \leq 0.4$, and
   y represents a number satisfying the condition of $0 < y \leq 0.7$, the standard composition being such that $\delta = 0$, and $z = 3$, with the proviso that the value of $\delta$ and the value of z may deviate from the standard values of 0 and 3, respectively, within a range such that the perovskite structure is capable of being attained.

2. A process for forming a ferroelectric film as defined in claim 1 wherein M in Formula (P) represents Bi.

3. A process for forming a ferroelectric film as defined in claim 1 wherein x in Formula (P) represents a number satisfying the condition of $0.05 \leq x \leq 0.25$.

4. A process for forming a ferroelectric film as defined in claim 1 wherein $\delta$ in Formula (P) represents a number satisfying the condition of $0 < \delta \leq 0.2$.

5. A process for forming a ferroelectric film as defined in claim 1 wherein the perovskite type oxide is substantially free from Si, Ge, and V.

6. A ferroelectric film obtainable by a process for forming a ferroelectric film as defined in claim 1.

7. A ferroelectric film as defined in claim 6 wherein the ferroelectric film has characteristics such that a value of (Ec1+Ec2)/(Ec1−Ec2)×100 (%) is equal to at most 25%, wherein Ec1 represents the coercive field on the positive electric field side in a bipolar polarization-electric field curve, and Ec2 represents the coercive field on the negative electric field side in the bipolar polarization-electric field curve.

8. A ferroelectric film as defined in claim 6 wherein the ferroelectric film has a film structure containing a plurality of pillar-shaped crystals.

9. A ferroelectric film as defined in claim 6 wherein the ferroelectric film has a film thickness of at least 3.0 µm.

10. A ferroelectric device, comprising:
   i) a ferroelectric film as defined in claim 6, and
   ii) electrodes for applying an electric field across the ferroelectric film.

11. A liquid discharge apparatus, comprising:
   i) a piezoelectric device, which is constituted of a ferroelectric device as defined in claim 10, and
   ii) a liquid storing and discharging member provided with:
      a) a liquid storing chamber, in which a liquid is to be stored, and
      b) a liquid discharge opening, through which the liquid is to be discharged from the liquid storing chamber to the exterior of the liquid storing chamber.

* * * * *